US012690234B2

(12) United States Patent
Li et al.

(10) Patent No.: US 12,690,234 B2
(45) Date of Patent: Jul. 21, 2026

(54) THIN-FILM TRANSISTOR HAVING A VERTICAL STRUCTURE AND AN ELECTRONIC DEVICE

(71) Applicant: WUHAN CHINA STAR OPTOELECTRONICS TECHNOLOGY CO., LTD., Wuhan (CN)

(72) Inventors: Zhifu Li, Wuhan (CN); Guanghui Liu, Wuhan (CN); Fei Ai, Wuhan (CN); Dewei Song, Wuhan (CN); Chengzhi Luo, Wuhan (CN)

(73) Assignee: WUHAN CHINA STAR OPTOELECTRONICS TECHNOLOGY CO., LTD., Wuhan (CN)

( * ) Notice: Subject to any disclaimer, the term of this patent is extended or adjusted under 35 U.S.C. 154(b) by 726 days.

(21) Appl. No.: 17/925,085

(22) PCT Filed: Nov. 4, 2022

(86) PCT No.: PCT/CN2022/129808
§ 371 (c)(1),
(2) Date: Nov. 14, 2022

(87) PCT Pub. No.: WO2024/036762
PCT Pub. Date: Feb. 22, 2024

(65) Prior Publication Data
US 2024/0234576 A1 Jul. 11, 2024

(30) Foreign Application Priority Data
Aug. 16, 2022 (CN) .......................... 202210980039.9

(51) Int. Cl.
H10D 30/67 (2025.01)
H10D 30/01 (2025.01)
(Continued)

(52) U.S. Cl.
CPC ..... H10D 30/6728 (2025.01); H10D 30/0321 (2025.01); H10D 30/6713 (2025.01);
(Continued)

(58) Field of Classification Search
CPC ........... H10D 30/6728; H10D 30/6757; H10D 30/6745; H10D 30/6723; H10D 30/0321;
(Continued)

(56) References Cited

U.S. PATENT DOCUMENTS

2019/0189745 A1* 6/2019 Balakrishnan ..... H10D 30/6728
2019/0305085 A1* 10/2019 Sung ...................... H10D 30/63
(Continued)

FOREIGN PATENT DOCUMENTS

CN 103311310 A 9/2013
CN 109065631 A 12/2018
(Continued)

OTHER PUBLICATIONS

International Search Report in International application No. PCT/CN2022/129808, mailed on Apr. 27, 2023.
(Continued)

*Primary Examiner* — Davienne N Monbleau
*Assistant Examiner* — Heim Kirin Grewal
(74) *Attorney, Agent, or Firm* — The Roy Gross Law Firm, LLC; Roy D. Gross

(57) ABSTRACT

The present application provides a thin-film transistor having a vertical structure and an electronic device. In the thin-film transistor having the vertical structure, the thin-film transistor includes a first doped portion and a second portion, the second doped portion is connected to and partly in contact with a channel portion through a via hole by arranging the second doped portion in the via hole of an insulating layer, which can reduce a contact area between the second doped portion and the channel portion, thereby
(Continued)

reducing ions diffusing into a channel region and improving device stability of the thin-film transistor. Also, in the thin-film transistor having the vertical structure, a projection area of the thin-film transistor can be reduced, improving an aperture ratio of a display panel.

20 Claims, 8 Drawing Sheets

(51) Int. Cl.
  *H10D 86/01* (2026.01)
  *H10D 86/40* (2025.01)
  *H10D 86/60* (2025.01)

(52) U.S. Cl.
  CPC ..... *H10D 30/6723* (2025.01); *H10D 30/6745* (2025.01); *H10D 30/6757* (2025.01); *H10D 86/0221* (2025.01); *H10D 86/421* (2025.01); *H10D 86/60* (2025.01)

(58) Field of Classification Search
  CPC .. H10D 86/0221; H10D 86/421; H10D 86/60; H10D 84/857; H10D 62/299
  See application file for complete search history.

(56)     References Cited

U.S. PATENT DOCUMENTS

| | | | |
|---|---|---|---|
| 2020/0098875 A1 | 3/2020 | Sung et al. | |
| 2020/0251595 A1* | 8/2020 | Zhang | H10D 86/0223 |
| 2020/0266301 A1* | 8/2020 | Cai | H10D 30/6733 |

FOREIGN PATENT DOCUMENTS

| | | | |
|---|---|---|---|
| CN | 109473358 A | 3/2019 | |
| CN | 109545690 A | 3/2019 | |
| CN | 110649101 A | 1/2020 | |
| CN | 111613654 A | 9/2020 | |
| CN | 111613664 A | 9/2020 | |
| KR | 20220074588 A | 6/2022 | |
| WO | WO-2022012251 A1 * | 1/2022 | H10D 30/0321 |

OTHER PUBLICATIONS

Written Opinion of the International Search Authority in International application No. PCT/CN2022/129808, mailed on Apr. 27, 2023.
Chinese Office Action issued in corresponding Chinese Patent Application No. 202210980039.9 dated Apr. 30, 2025, pp. 1-10, 22pp.

* cited by examiner

FIG. 1 -PRIOR ART

THIN-FILM TRANSISTOR HAVING A VERTICAL STRUCTURE AND AN ELECTRONIC DEVICE

CROSS-REFERENCE TO RELATED APPLICATIONS

This application is a US National Phase application based upon International Application No. PCT/CN2022/129808, filed on Nov. 4, 2022, which claims the benefit of priority to Chinese Patent Application No. 202210980039.9 filed on Aug. 16, 2022, titled "THIN-FILM TRANSISTOR HAVING A VERTICAL STRUCTURE AND AN ELECTRONIC DEVICE", the entire contents of which are hereby incorporated by reference in its entirety in this application.

FIELD OF DISCLOSURE

The present application relates to a field of display technology, and more specifically, to a thin-film transistor having a vertical structure and an electronic device.

BACKGROUND

With a development of display technology, existing display devices need to reduce a size and an occupied area of thin-film transistors in order to achieve narrow bezel, high aperture ratio, high brightness, and high resolution. However, mobility of polysilicon thin-film transistors is relatively small, and in order to improve mobility of thin-film transistors, a channel length needs to be reduced, which means an occupied area of an active layer needs to be increased, and the channel length is limited by a process, resulting in limited reduction. As a result, a display device cannot balance the mobility and the size of thin-film transistors. In order to solve this problem, the existing display devices are designed with a thin-film transistor having a vertical structure. By using a thickness of the active layer as a channel length of the thin-film transistor, it will not be limited by the process, and a thin-film transistor with an extremely small channel length can be realized. However, during a preparation of the thin-film transistor having the vertical structure, an ohmic contact region is disposed on upper and lower sides of a channel region, resulting in ions in the ohmic contact region easily diffusing into a channel and causing device stability to deteriorate.

Therefore, existing thin-film transistors having a vertical structure have a technical problem that the ions in the ohmic contact region are easily diffused into the channel, resulting in poor stability of the thin-film transistors.

SUMMARY

Technical Problem

Embodiments of the present application provide a thin-film transistor having a vertical structure and an electronic device, which are used to alleviate a technical problem of existing thin-film transistors having a vertical structure where ions in a contact region tend to diffuse into a channel resulting in poor stability of the thin-film transistor.

Technical Solutions

An embodiment of the present application provides a thin-film transistor having a vertical structure, and the thin-film transistor having the vertical structure includes:

an insulating substrate;

an active layer, disposed on a side of the insulating substrate, the active layer including a first doped portion, a channel portion, and a second doped portion provided in a stack; and an insulating layer, disposed on a side of the channel portion away from the first doped portion, and the insulating layer includes via holes;

wherein the second doped portion is disposed in the via holes, and the second doped portion is connected to and partly in contact with the channel portion through the via holes.

In some embodiments, the thin-film transistor having the vertical structure further includes a source/drain layer, the source/drain layer is disposed on a side of the insulating layer away from the active layer, the source/drain layer includes a first electrode and a second electrode, the via holes include a first via hole and a second via hole, the first electrode is electrically connected to the first doped portion through the first via hole, the second doped portion is disposed in the second via hole, and the second electrode is in contact with the second doped portion.

In some embodiments, material of the first doped portion includes N-type doped polysilicon, and material of the second doped portion includes N-type doped amorphous silicon.

In some embodiments, a doping ion concentration of the first doped portion on a side close to the insulating substrate is greater than a doping ion concentration of the first doped portion on a side close to the channel portion.

In some embodiments, the first doped portion includes a heavily doped portion and a first lightly doped portion, a doping ion concentration of the heavily doped portion of the first doped portion is greater than a doping ion concentration of the first lightly doped portion of the first doped portion, and the first lightly doped portion of the first doped portion is disposed between the heavily doped portion and the channel portion.

In some embodiments, the lightly doped portion of the first doped portion includes a third via hole, and the first electrode is electrically connected to the heavily doped portion of the first doped portion through the first via hole and the third via hole, and the first electrode is electrically connected to the lightly doped portion of the first doped portion through the first via hole and the third via hole.

In some embodiments, a width of the heavily doped portion of the first doped portion is greater than a width of the lightly doped portion of the first doped portion, and the first electrode is electrically connected to the first-heavily doped portion of the first doped portion through the first via hole.

In some embodiments, material of the first doped portion includes N-type doped amorphous silicon.

In some embodiments, a doping ion concentration of the second doped portion on a side close to the source/drain layer is greater than a doping ion concentration of the second doped portion on a side close to the channel portion.

In some embodiments, the second doped portion includes a heavily doped portion and a lightly doped portion, and a doping ion concentration of the second heavily doped portion of the second doped portion is greater than a doping ion concentration of the lightly doped portion of the second doped portion, the lightly doped portion of the second doped portion is disposed between the second heavily doped portion of the second doped portion and the channel portion,

3 and the lightly doped portion of the second doped portion is in contact with a side part of the heavily doped portion of the second doped portion.

In some embodiments, a ratio of a thickness of the heavily doped portion of the second doped portion to a thickness of the lightly doped portion of the second doped portion is greater than or equal to 5.

In some embodiments, the second electrode extends into the second via hole, and the second heavily doped portion is in contact with a side surface of the second electrode.

In some embodiments, a ratio of the doping ion concentration of the heavily doped portion of the second doped portion to the doping ion concentration of the lightly doped portion of the second doped portion is 10:1.

In some embodiments, the second doped portion includes a first portion disposed on the insulating layer away from the channel portion and a second portion located in the second via hole, and the first portion is connected to the second portion.

In some embodiments, a diameter of the second via hole ranges from 2 μm to 4 μm.

In some embodiments, a width of the first doped portion is greater than a width of the channel portion.

In some embodiments, the thin-film transistor having the vertical structure further includes a gate disposed on a sidewall of the insulating layer, and an orthographic projection of the gate on the sidewall of the insulating layer covers the channel portion.

In some embodiments, the thin-film transistor having vertical structure further comprises:

a light-shielding layer disposed between the insulating substrate and the active layer, and an orthographic projection of the light-shielding layer on the insulating substrate covers at least an orthographic projection of the second doped portion on the insulating substrate.

In some embodiments, the gate is connected to the light-shielding layer.

Also, an embodiment of the present application provides an electronic device including the thin-film transistor having the vertical structure as described in any of the aforementioned embodiments.

Advantages of Present Disclosure

The present application provides the thin-film transistor having the vertical structure and the electronic device; the thin-film transistor having the vertical structure includes the insulating substrate, the active layer, and the insulating layer, the active layer is disposed on the side of the insulating substrate, and the active layer includes the first doped portion, the channel portion, and the second doped portion provided in a stack, the insulating layer is disposed on the side of the channel portion away from the first doped portion, the insulating layer includes the via hole, wherein the second doped portion is disposed in the via hole, and the second doped portion is connected to and partly in contact with the channel portion through the via hole. In the present application, by stacking the first doped portion, the channel portion, and the second doped portion, a polysilicon thin-film transistor with extremely small channel length can be realized, and by arranging the second doped portion in the via hole of the insulating layer, in this way, the second doped portion is connected to and partly in contact with the channel portion through the via hole, which can reduce a contact area between the second doped portion and the channel portion, thereby reducing the ions diffusing into a channel region and improving device stability of the thin-film transistor. Also, in the present application, by stacking the first doped portion, the channel portion, and the second doped portion, a projection area of the thin-film transistor is reduced, thus improving an aperture ratio of a display panel, which facilitates a development of products with high resolution and high refresh rate and even realizes functions of some chips.

BRIEF DESCRIPTION OF DRAWINGS

The technical solutions and other beneficial effects of the present application will be made apparent by following detailed description of specific embodiments of the present application, in conjunction with the accompanying drawings.

DETAILED DESCRIPTION OF PREFERRED EMBODIMENTS

Hereinafter, technical solutions embodied by embodiments of the present application will be described in a clear and comprehensive manner in reference to the accompanying drawings intended for the embodiments. It is clear that the embodiments described herein constitute merely some rather than all of the embodiments of the present application, and that those of ordinary skill in the art will be able to derive other embodiments based on these embodiments without making inventive efforts, thus such derived embodiments shall all fall in the protection scope of the present application.

Figure 1:
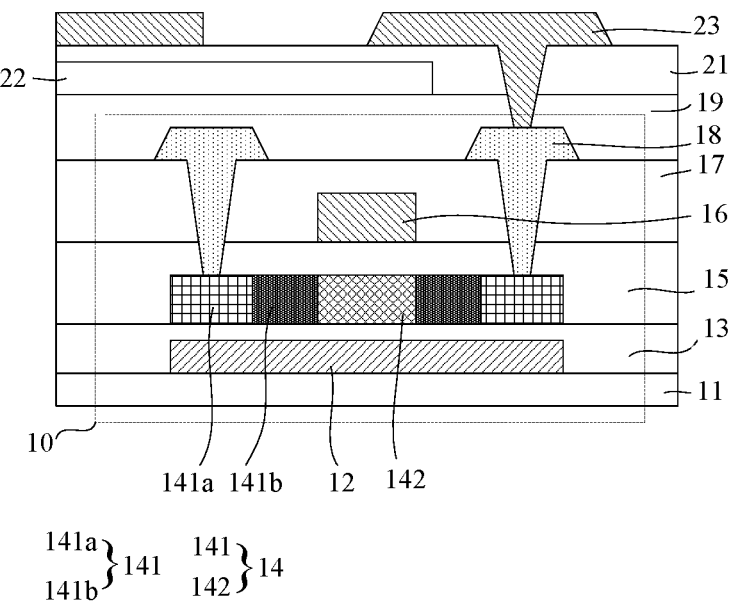
FIG. 1 is a schematic structural diagram of a conventional display device.

As shown in FIG. 1, a conventional display device includes a substrate 11, a light-shielding layer 12, a buffer layer 13, an active layer 14, a gate insulating layer 15, a gate layer 16, an interlayer insulating layer 17, a source/drain layer 18, a planarization layer 19, a first electrode layer 22, a passivation layer 21, and a second electrode layer 23. As can be seen from FIG. 1, the active layer 14 includes an ohmic contact region 141 and a channel region 142, and the ohmic contact region 141 includes a heavily doped region 141a and a lightly doped region 141b. Each region of the active layer is arranged in a horizontal direction, occupying a large area, and a channel length of the active layer is small due to the channel length limited by exposure accuracy and etching accuracy, resulting in low mobility of thin-film transistor 10. In order to improve the mobility of the thin-film transistor, existing display devices are designed with thin-film transistors having a vertical structure, and the channel length of the active layer is a thickness of the active layer, which can realize thin-film transistors with extremely small channel length. However, during a preparation of the thin-film transistors having the vertical structure, an ohmic contact region is disposed on an upper side and a lower side of the channel region, resulting in ions in the ohmic contact region easily diffusing into the channel and causing device stability to deteriorate. Therefore, existing thin-film transistors having a vertical structure have a technical problem that ions in the ohmic contact region are easily diffused into the channel, resulting in poor stability of the thin-film transistor.

In view of an aforementioned technical problem, embodiments of the present application provide a thin-film transistor having a vertical structure and an electronic device, so as to alleviate the aforementioned technical problem.

Figure 2:
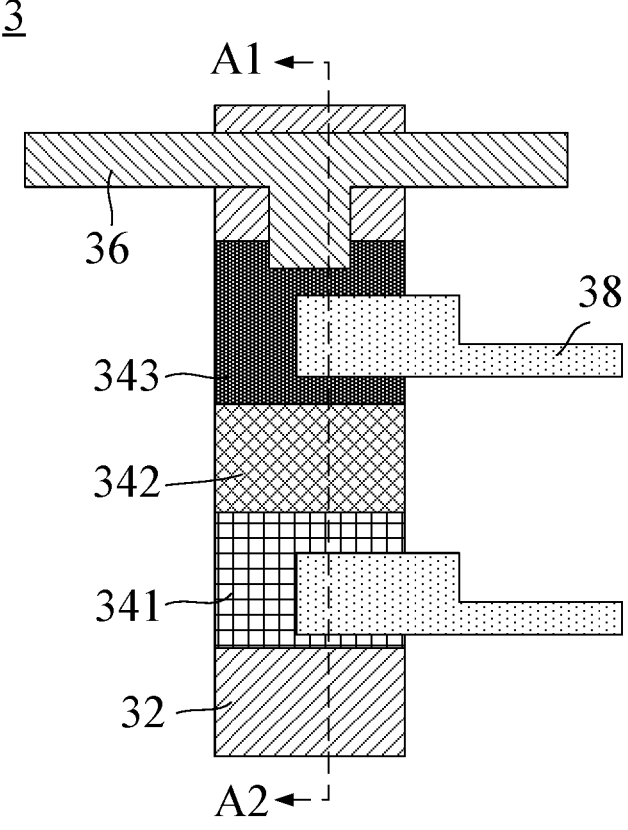
FIG. 2 is a first schematic diagram of a thin-film transistor having a vertical structure provided by an embodiment of the present application.
Figure 3:
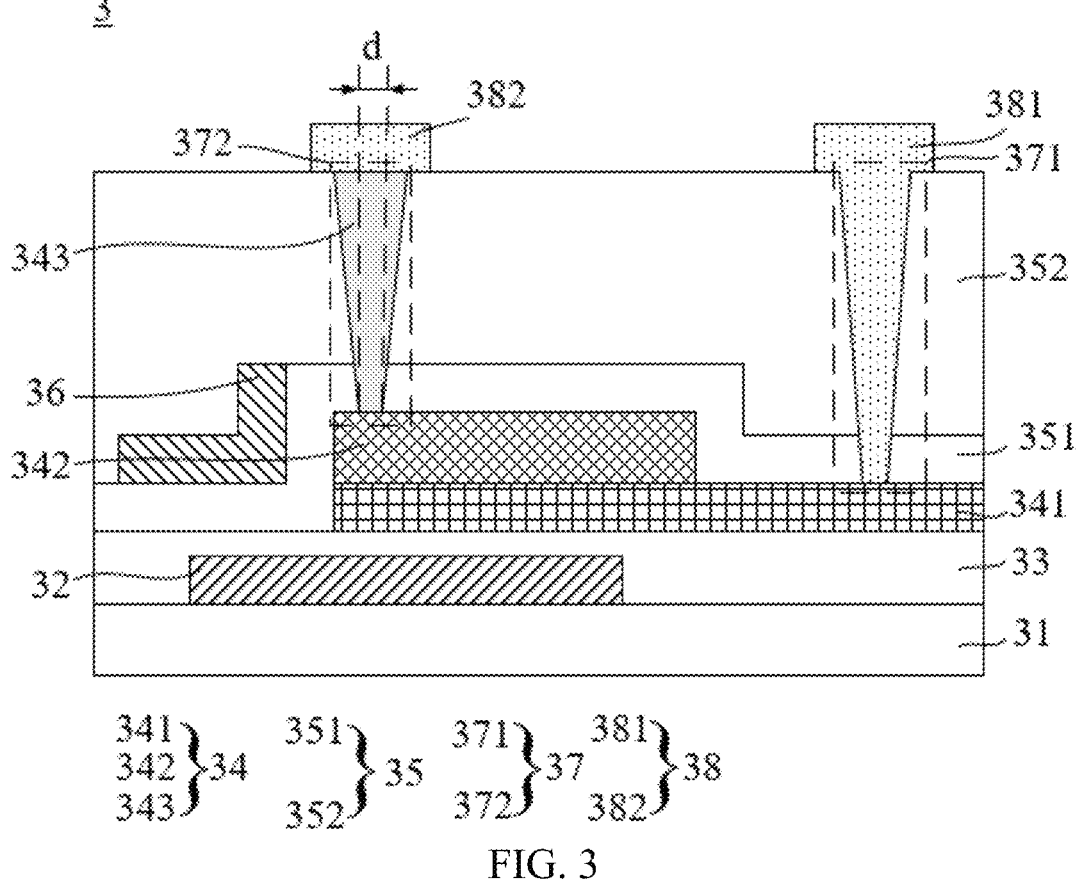
FIG. 3 is a cross-sectional view of A1-A2 of the thin-film transistor having the vertical structure in FIG. 2.

As shown in FIG. 2 and FIG. 3, an embodiment of the present application provides the thin-film transistor having the vertical structure, and thin-film transistor 3 with the vertical structure includes:

an insulating substrate 31;

an active layer 34 disposed on a side of the insulating substrate 31, and the active layer 34 includes a first doped portion 341, a channel portion 342 and a second doped portion 343 provided in a stack;

an insulating layer 35 disposed on a side of the channel portion 342 away from the first doped portion 341, and the insulating layer 35 includes via holes 37;

wherein the second doped portion 343 is disposed in the via holes 37, and the second doped portion 343 is connected to and partly in contact with the channel portion 342 through the via holes 37.

Embodiments of the present application provide the thin-film transistor having the vertical structure, and the thin-film transistor having the vertical structure can realize a poly-silicon thin-film transistor with an extremely small channel length by stacking the first doped portion, the channel portion, and the second doped portion, and the second doped portion is connected to and partly in contact with the channel portion through the via hole by arranging the second doped portion in the via hole of the insulating layer, which can reduce a contact area between the second doped portion and the channel portion, thereby reducing ions diffusing into the channel region and improving stability of the thin-film transistor. Also, in the present application, by stacking the first doped portion, the channel portion, and the second doped portion, a projection area of the thin-film transistor is reduced, improving an aperture ratio of a display panel, which facilitates a development of products with high resolution and high refresh rate, and even realizes functions of some chips.

It should be noted that FIG. 3 is a cross-sectional view of A1-A2 of the thin-film transistor with the vertical structure in FIG. 2. In FIG. 3, since the second doped portion is disposed in the via hole, the via hole is not shown in FIG. 3, and a reference numeral 37 indicates a setting position of the via hole.

In an embodiment, as shown in FIG. 3, the thin-film transistor 3 having the vertical structure further includes a source/drain layer 38, and the source/drain layer 38 is disposed on a side of the insulating layer 35 away from the active layer 34. The source/drain layer 38 includes a first electrode 381 and a second electrode 382, the via holes 37 includes a first via hole 371 and a second via hole 372, and the first electrode 381 is electrically connected to the first doped portion 341 through the first via hole 371, and the second doped portion 343 is disposed in the second via hole 372, and the second electrode 382 is in contact with the second doped portion 343.

In the embodiment of the present application, when the second doped portion is arranged in the via hole to reduce the contact area between the second doped portion and the channel portion so as to reduce the ions diffusing into the channel, in order to realize a normal function of the thin-film transistor, when connecting the second doped portion and the second electrode of the source/drain layer, the second electrode can be directly arranged on the second via hole, so that the second electrode can be directly contacted with the second doped portion to realize electrical connection without setting a via hole for connecting the second doped portion. For the first doped portion, since the first doped portion is located under the channel portion, the first via hole can be formed by etching the insulating layer, so that the source/drain layer is connected to the first doped portion through the first via hole of the insulating layer, thus realizing a connection between a source/drain layer and the active layer, and a normal operation of the thin-film transistor can be realized through a signal input of the first electrode and the second electrode. In addition, the second electrode in this structure is directly connected to the second doped portion, so that there is no need to provide an additional via hole for connecting the second doped portion and the second electrode, thereby reducing process steps.

In response to a technical problem that poor crystallization of polysilicon formed in the via hole may lead to poor performance of the thin-film transistor, in one embodiment, material of the first doped portion includes N-type doped polysilicon, and material of the second doped portion includes N-type doped amorphous silicon. By making the material of the first doped portion N-type doped polysilicon, the first doped portion conducts better with the first electrode, and by making the material of the second doped portion N-type doped amorphous silicon, when the second doped portion is disposed in the via hole, a problem of poor polysilicon crystallization effect resulting in poor performance of the thin-film transistor can be avoided, thereby improving performance of the thin-film transistor.

In response to a problem that a reduction of a channel size of the active layer leads to an increase in leakage current, in one embodiment, a doping ion concentration of the first doped portion on a side close to the insulating substrate is greater than a doping ion concentration of the first doped portion on a side close to the channel portion. By making the doping ion concentration of the first doped portion on the side close to the insulating substrate greater than the doping ion concentration of the first doped portion on the side close to the channel portion, the first doped portion has a stacked structure with a heavily doped bottom layer and a lightly doped top layer, and electrons need to pass through the heavily doped region and the lightly doped region when moving, reducing leakage current of the thin-film transistor.

Figure 4:
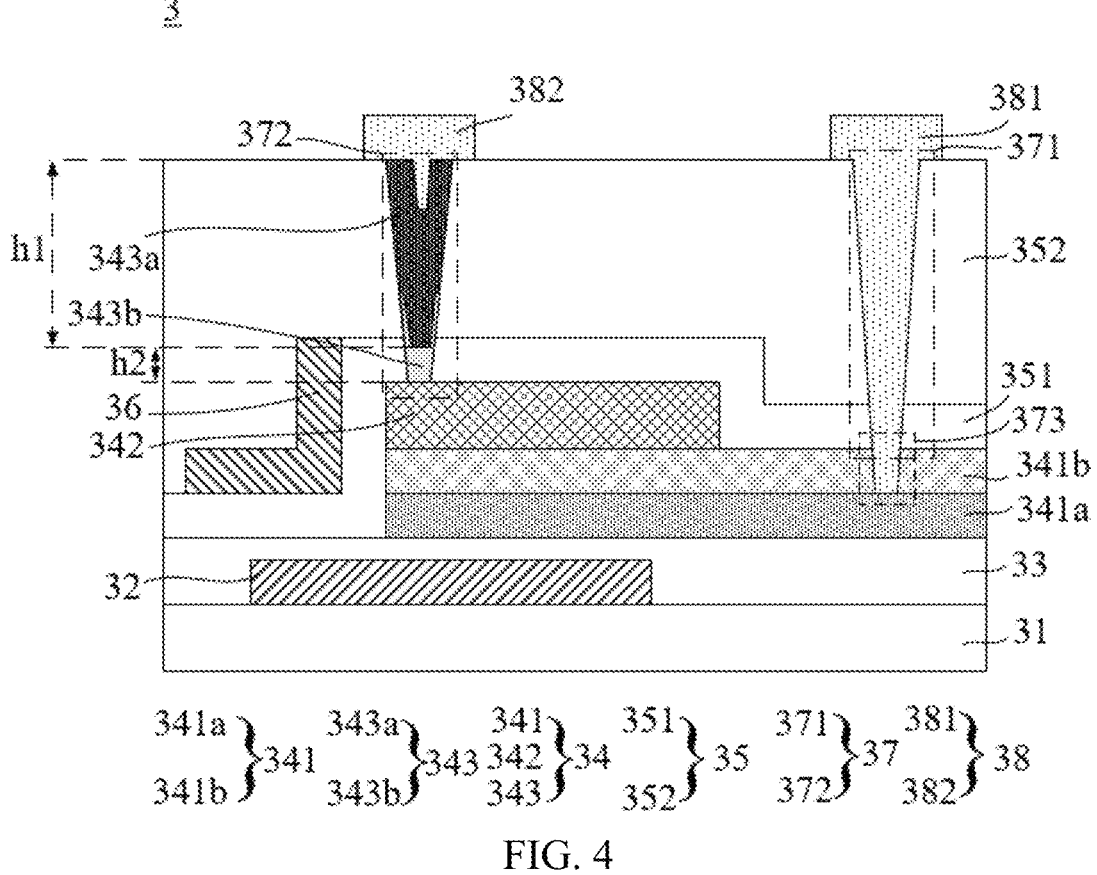
FIG. 4 is a second schematic diagram of the thin-film transistor having the vertical structure provided by an embodiment of the present application.

In an embodiment, as shown in FIG. 4, the first doped portion 341 includes a first heavily doped portion 341a and a first lightly doped portion 341b, and a doping ion concentration of the first heavily doped portion 341a is greater than a doping ion concentration of the first lightly doped portion 341b, and the first lightly doped portion 341b is disposed between the first heavily doped portion 341a and the channel portion 342. By making the first doped portion include the first heavily doped portion and the first lightly doped portion and making the doping ion concentration of the first heavily doped portion greater than the doping ion concentration of the first lightly doped portion, a stacked structure of the first heavily doped portion and the first lightly doped portion can be formed, so that the electrons need to pass through the first heavily doped portion and the first lightly doped portion when moving, thereby reducing the leakage current of the thin-film transistor.

In an embodiment, as shown in FIG. 4, the first lightly doped portion 341b includes a third via hole 373, and the first electrode 381 is electrically connected to the first heavily doped portion 341a through the first via hole 371 and the third via hole 373, and the first electrode 381 is electrically connected to the first lightly doped portion 341b through the first via hole 371 and the third via hole 373. By forming the third via hole in the first lightly doped portion, the first electrode can be connected to the first heavily doped portion through the first via hole and the third via hole, so that the electrons can move toward the first lightly doped portion along the first heavily doped portion, thereby reducing the leakage current of the thin-film transistor and improving the performance of the thin-film transistor.

Specifically, the first electrode is electrically connected to the first lightly doped portion through the first via hole and the third via hole, while the first electrode is electrically connected to the first heavily doped portion through the first via hole and the third via hole, since impedance of the first heavily doped portion is smaller than impedance of the first lightly doped portion, the electrons will still move from the first heavily doped portion to the first lightly doped portion to realize conduction of the thin-film transistor and reduce the leakage current of the thin-film transistor, thereby improving the performance of the thin-film transistor.

Specifically, by forming the third via hole in the first lightly doped portion, the first via hole and the third via hole are integrally arranged, so that the first via hole and the third via hole can be formed by etching the insulating layer and the first lightly doped portion in a same process when forming the first via hole and the third via hole, thereby reducing process steps of the thin-film transistor and improving preparation efficiency of the thin-film transistor.

Figure 5:
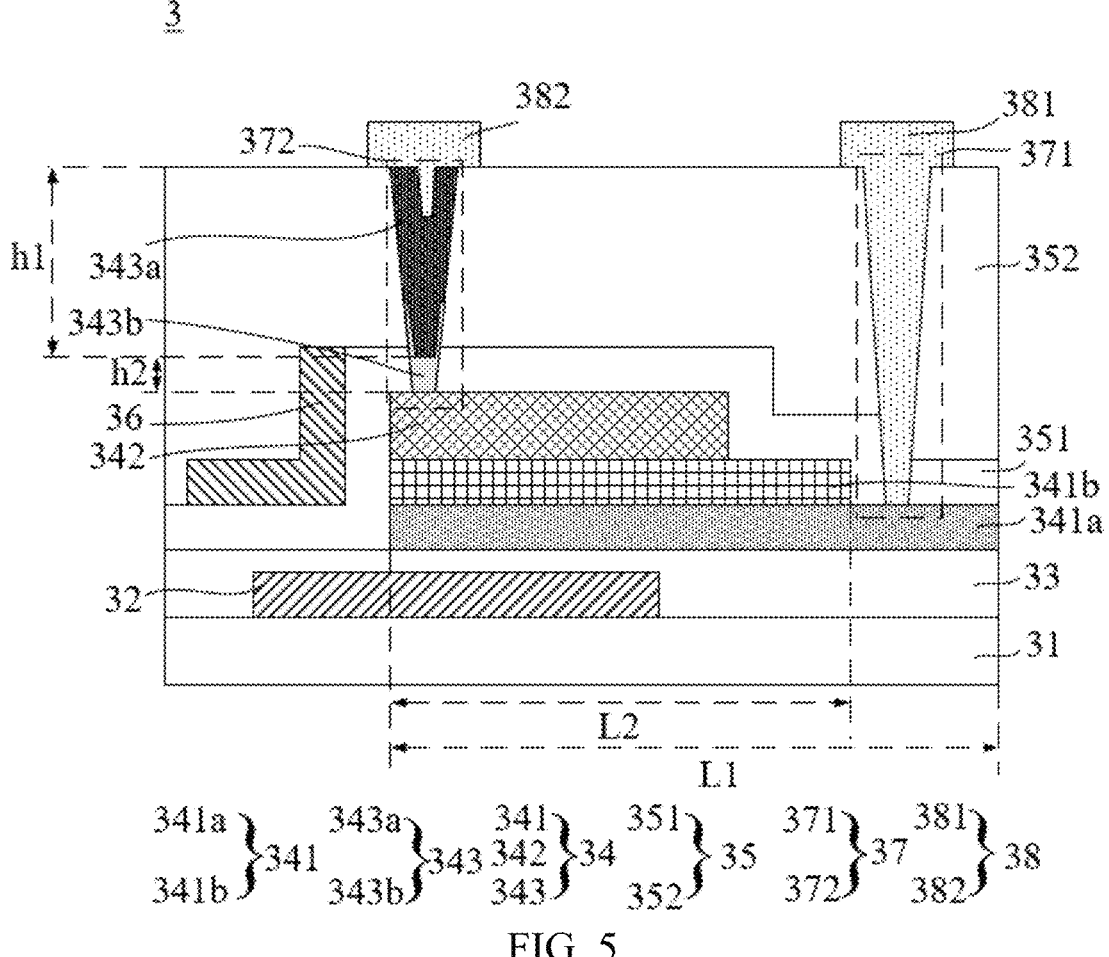
FIG. 5 is a third schematic diagram of the thin-film transistor having the vertical structure provided by an embodiment of the present application.

In response to a problem that a connection of the first electrode and the first lightly doped portion may lead to electron movement from the first lightly doped portion to cause leakage current, resulting in poor performance of a thin-film transistor device, in an embodiment, as shown in FIG. 5, a width L1 of the first heavily doped portion 341a is greater than a width L2 of the first lightly doped portion 341b, and the first electrode 381 is electrically connected to the first heavily doped portion 341a through the first via hole 371. By making the width of the first heavily doped portion greater than the width of the first lightly doped portion, the first electrode can be directly connected to the first heavily doped portion through the first via hole, thus avoiding a connection of the first electrode and the first lightly doped portion leading to an increase in leakage current of the thin-film transistor, and the electrons will pass through the first lightly doped portion and the first heavily doped portion, thereby reducing the leakage current of the thin-film transistor and improving the performance of the thin-film transistor device.

Specifically, as shown in FIG. 5, in a region where the first heavily doped portion 341a exceeds the first lightly doped portion 341b, the first electrode 381 is electrically connected to the first heavily doped portion 341a through the first via hole 371, that is, when the first electrode is provided, the first electrode is electrically connected to the first heavily doped portion in the region where the first heavily doped portion exceeds the first lightly doped portion, it is possible to keep the first electrode from contacting the first lightly doped portion, thereby avoiding an increase in the leakage current of the thin-film transistor and improving the performance of the thin-film transistor.

In response to a problem that polysilicon has difficulty forming a structure with a high doping concentration in a bottom layer and a low doping concentration in a surface layer along a thickness direction of the polysilicon, in one embodiment, the material of the first doped portion includes N-type doped amorphous silicon. By using N-type doped amorphous silicon as the material of the first doped portion, the first doped portion can be formed by chemical vapor deposition when forming the first lightly doped portion and the second lightly doped portion, and then the structure with the high doping concentration in the bottom layer and the low doping concentration in the surface layer can be formed by controlling a ratio of phosphine, so that the electrons will pass through the first heavily doped portion and the first lightly doped portion in sequence, thereby reducing the leakage current and improving the performance of the thin-film transistor.

In an embodiment, a ratio of the doping ion concentration of the first heavily doped portion to the doping ion concentration of the first lightly doped portion is 10:1.

In response to a problem that the reduction of the channel size of the active layer leads to the increase in the leakage current, in one embodiment, a doping ion concentration of the second doped portion on a side close to the source/drain layer is greater than a doping ion concentration of the second doped portion on a side close to the channel portion. By making the doping ion concentration of the second doped portion on the side close to the source/drain layer greater than the doping ion concentration of the second doped portion on the side close to the channel portion, the second doped portion has a stacked structure with a lightly doped bottom layer and a heavily doped top layer, and the electrons need to pass through the heavily doped region and the lightly doped region when moving, reducing the leakage current of the thin-film transistor.

In an embodiment, as shown in FIG. 4, the second doped portion 343 includes a second heavily doped portion 343a and a second lightly doped portion 343b, and a doping ion concentration of the second heavily doped portion 343a is greater than a doping ion concentration of the second lightly doped portion 343b, the second lightly doped portion 343b is disposed between the second heavily doped portion 343a and the channel portion 342, and the second lightly doped portion 343b is in contact with a side part of the second heavily doped portion 343a. By making the second doped portion include the second heavily doped portion and the second lightly doped portion, the second heavily doped portion is electrically connected to the first electrode, and the second lightly doped portion is disposed between the second heavily doped portion and the channel portion, a stacked structure of the second heavily doped portion and the second lightly doped portion can be formed, so that the electrons need to pass through the second heavily doped portion and the second lightly doped portion when moving, thereby reducing the leakage current of the thin-film transistor. In addition, the second lightly doped portion is in contact with a side part of the second heavily doped portion, thereby increasing a contact area between the second lightly doped portion and the second heavily doped portion and improving the performance of the thin-film transistor.

In one embodiment, as shown in FIG. 4, a ratio of a thickness h1 of the second heavily doped portion 343a to a thickness h2 of the second lightly doped portion 343b is greater than or equal to 5. By making the ratio of the thickness of the second heavily doped portion to the thickness of the second lightly doped portion greater than or equal to 5, the thickness of the second heavily doped portion is larger, and the active layer can be conducted when a function of the thin-film transistor is realized, so that the thin-film transistor works normally.

Specifically, a spacing between a bottom of the first heavily doped portion and a top of the first heavily doped portion is used as a thickness of the first heavily doped portion, and a spacing between the bottom of the first heavily doped portion and the bottom of the first lightly doped portion is used as a thickness of the first lightly doped portion.

In one embodiment, as shown in FIG. 4, the second electrode 382 extends into the second via hole 372, and the second heavily doped portion 343a is in contact with the side surface of the second electrode 382. By extending the second electrode into the second via hole, a contact area between the second heavily doped portion and the second electrode is enlarged, thereby improving conduction effect between the second electrode and the second heavily doped portion, thus avoiding poor contact between the second heavily doped portion and the second electrode, and improving the performance of the thin-film transistor.

In an embodiment, a ratio of the doping ion concentration of the second heavily doped portion to the doping ion concentration of the second lightly doped portion is 10:1.

Specifically, in the aforementioned embodiments, the first doped portion includes the first lightly doped portion and the first heavily doped portion, and the second doped portion includes the second lightly doped portion and the second heavily doped portion, respectively. However, the embodiments of the present application are not limited to this. When the first doped portion includes the first lightly doped portion and the first heavily doped portion, the second doped portion may also include the second lightly doped portion and the second heavily doped portion. For a design of the first lightly doped portion, the first heavily doped portion, the second lightly doped portion, and the second heavily doped portion, reference may be made to the aforementioned embodiments, and details are not described herein again.

In an embodiment, the second doped portion includes a first portion disposed on the insulating layer away from the channel portion and a second portion located in the second via hole, and the first portion and the second portion are connected. When the second electrode is connected to the second doped portion, the second doped portion can also be arranged outside the second via hole, the second doped portion includes the first portion located on the insulating layer and the second portion located inside the second via hole, the second electrode can be in contact with the first portion to realize the connection between the second electrode and the second doped portion and to increase the contact area between the second doped portion and the second electrode, thereby avoiding poor contact between the second doped portion and the second electrode, increasing an area of the second doped portion, and improving the performance of the thin-film transistor.

Specifically, when forming the second doped portion, amorphous silicon can be deposited into the via hole, so that the amorphous silicon extends from the insulating layer into the via hole, and the amorphous silicon is etched to form the first portion and the second portion, then the first portion can be connected to the second electrode, so as to realize a normal operation of the thin-film transistor.

In one embodiment, as shown in FIG. 3, a diameter d of the second via hole 372 ranges from 2 μm to 4 μm. In response to a fact that a diameter of the second via hole is too large, ions will diffuse into the channel portion, and that the diameter of the second via hole is too small, which will cause the second doped portion to have poor contact with the channel portion and the second electrode, therefore the diameter of the second via hole is set to a range from 2 μm to 4 μm, so that the second doped portion in the second via hole have better contact with the channel portion and the second electrode, and the second via hole are not too large to cause the ions to diffuse into the channel portion.

Specifically, as shown in FIG. 3, when a cross-section of the second via hole is an inverted trapezoid, a width of a lower side of the inverted trapezoid is used as the diameter of the second via hole.

In one embodiment, a width of the first doped portion is greater than a width of the channel portion. By making the width of the first doped portion greater than the width of the channel portion, when the first electrode is connected to the first doped portion, the first electrode can be connected to a part of the first doped portion beyond the channel portion, thereby realizing a connection between the first electrode and the first doped portion.

In one embodiment, as shown in FIG. 3, the thin-film transistor 3 having the vertical structure further includes a gate electrode 36 disposed on a sidewall of the insulating layer 35, and an orthographic projection of the gate electrode 36 on the sidewall of the insulating layer 35 covers the channel portion 342. By arranging the gate on the sidewall of the insulating layer to prevent the gate from affecting an arrangement of the second doped portion, and by making the orthographic projection of the gate on the sidewall of the insulating layer cover the channel portion, the gate can control the channel portion to realize a normal function of the thin-film transistor.

In response to a technical problem that the active layer is exposed to light and the performance will deteriorate, in an embodiment, as shown in FIG. 3, the thin-film transistor 3 having the vertical structure further includes:

a light-shielding layer 32, disposed between the insulating substrate 31 and the active layer 34, and an orthographic projection of the light-shielding layer 32 on the insulating substrate 31 covers at least an orthographic projection of the second doped portion 343 on the insulating substrate 31. By making the orthographic projection of the light-shielding layer on the insulating substrate cover at least the orthographic projection of the second doped portion on the insulating substrate, the light-shielding layer prevents the active layer from being exposed to light which may cause deterioration of performance.

In response to a problem that controllability is insufficient when the gate is arranged on a side of the insulating layer, in one embodiment, the gate is connected to the light-shielding layer. By connecting the gate to the light-shielding layer, the active layer can be semi-surrounded, and controllability of the gate can be improved.

In one embodiment, material of the light-shielding layer includes molybdenum, titanium, tungsten, or a stack thereof.

In one embodiment, as shown in FIG. 3, the thin-film transistor 3 having the vertical structure further includes a buffer layer 33.

In one embodiment, material of the buffer layer includes silicon oxide, silicon nitride, silicon oxynitride, or a stack thereof.

In one embodiment, the insulating layer 35 includes a gate insulating layer 351 and an interlayer insulating layer 352.

In one embodiment, material of the gate insulating layer includes silicon oxide, silicon nitride, silicon oxynitride, or a stack thereof.

In one embodiment, a thickness of the gate insulating layer ranges from 30 nm to 200 nm.

In one embodiment, material of the gate layer includes molybdenum, titanium, tungsten, or a stack thereof.

In one embodiment, a thickness of the gate layer ranges from 0.1 μm to 1 μm.

In one embodiment, material of the interlayer insulating layer includes a stack of silicon oxide and silicon nitride.

In one embodiment, material of the source/drain layer includes molybdenum, titanium, tungsten, aluminum, copper, or a stack thereof.

Figure 6:
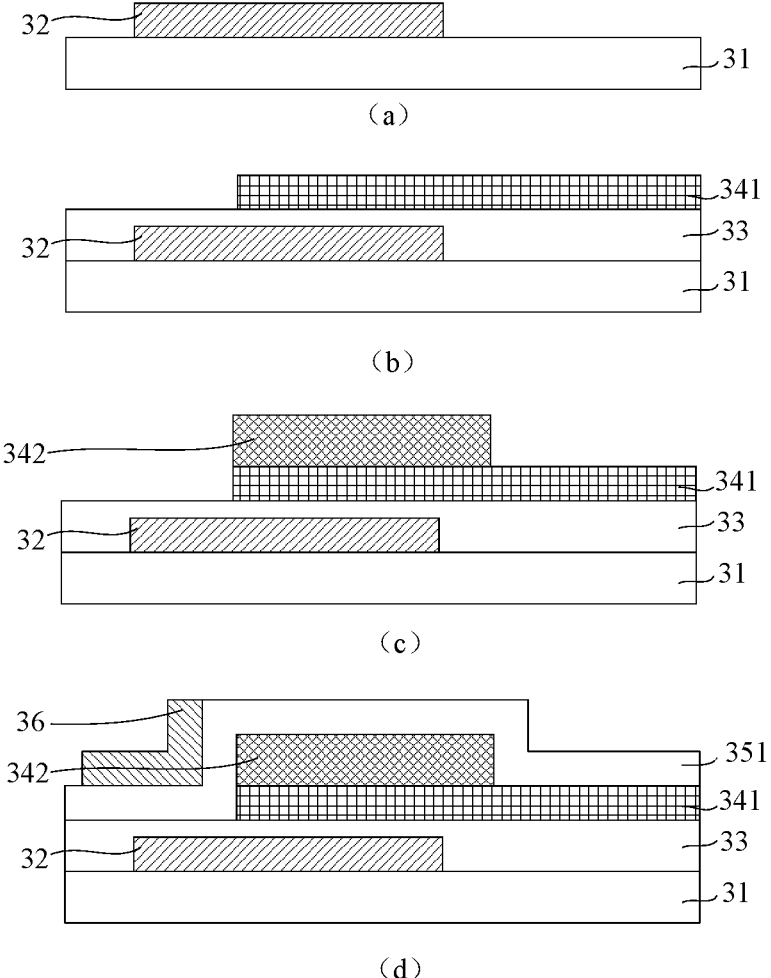
FIG. 6 is a first schematic diagram of the thin-film transistor having the vertical structure corresponding to each step in a method for preparing the thin-film transistor having the vertical structure provided by an embodiment of the present application.

Also, an embodiment of the present application provides a method for preparing a thin-film transistor having a vertical structure. The thin-film transistor having the vertical structure is prepared as described in any one of the above embodiments and the method for preparing the thin-film transistor having the vertical structure includes:

Providing an insulating substrate and forming a light-shielding layer on the insulating substrate; a structure of the thin-film transistor having a vertical structure corresponding to this step is shown in (a) in FIG. 6.

Specifically, a metal can be deposited on the insulating substrate, and then exposed and etched to form a light-shielding layer.

Depositing a buffer layer and a first doped portion on the light-shielding layer; a structure of the thin-film transistor having the vertical structure corresponding to this step is shown in (b) in FIG. 6.

Specifically, when forming the first doped portion on the buffer layer, amorphous silicon can be formed into a film by chemical vapor deposition, and hydrogen silicide and hydrogen gas can be introduced during film formation, and then the amorphous silicon can be converted into polysilicon through laser annealing, and then the polysilicon is patterned by exposure and etching, and finally, ion implantation is used to perform phosphorus ion doping to obtain the first doped portion.

Specifically, a thickness of the first doped portion ranges from 10 nm to 100 nm.

Specifically, when the first doped portion includes the first lightly doped portion and the first heavily doped portion, the amorphous silicon can be formed into a film by chemical vapor deposition on the buffer layer, and hydrogen silicide, hydrogen gas, and hydrogen phosphide can be introduced in sequence during the film formation, and a two-step film formation is required. In a first step, a flow rate of hydrogen phosphide is large, and in a second step, the flow rate of hydrogen phosphide is small, this is followed by exposure and etching to form the first doped portion.

Specifically, since phosphorus ions are contained in an amorphous silicon film formation process, no additional ion implantation is required.

Specifically, a thickness of the first doped portion ranges from 10 nm to 300 nm.

Forming a channel portion on the first doped portion; a structure of the thin-film transistor having the vertical structure corresponding to this step is shown in (c) in FIG. 6.

Specifically, an amorphous silicon layer is deposited on the first doped portion, and amorphous silicon is converted into polysilicon through laser annealing, and then the polysilicon is patterned by exposure and etching to form the channel portion.

Specifically, a thickness of the channel portion ranges from 10 nm to 100 nm.

Forming a gate insulating layer and a gate layer on the channel portion; a structure of the thin-film transistor having the vertical structure corresponding to this step is shown in (d) in FIG. 6.

Figure 7:
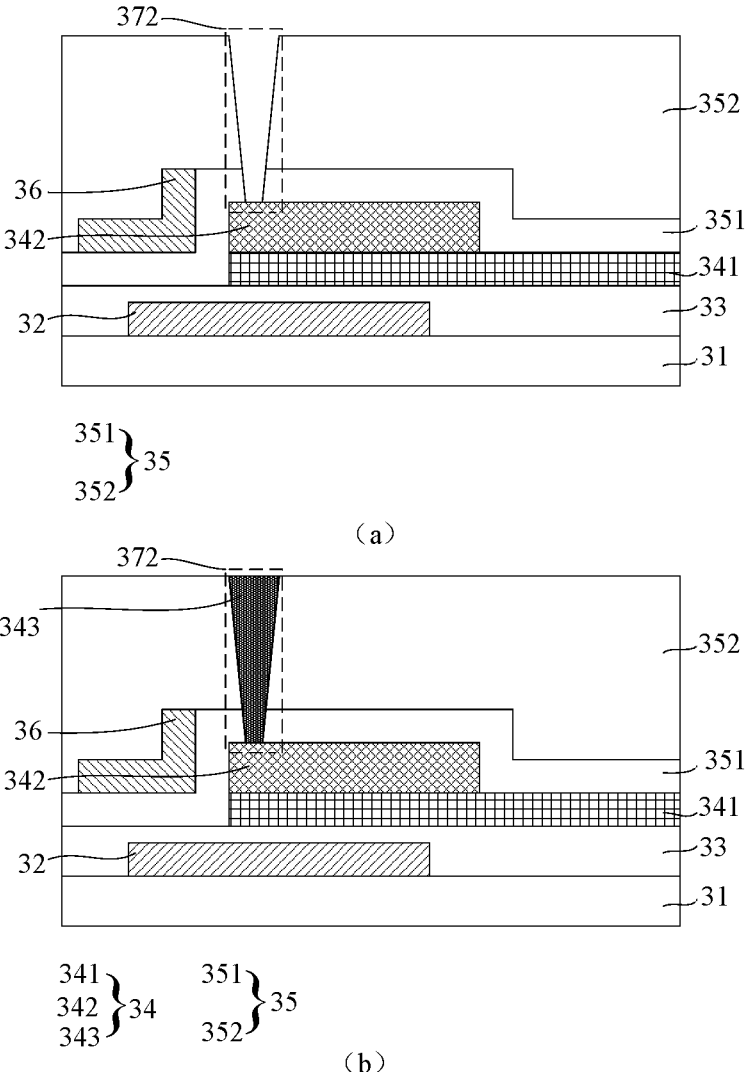
FIG. 7 is a second schematic diagram of the thin-film transistor having the vertical structure corresponding to each step in the method for preparing the thin-film transistor having the vertical structure provided by an embodiment of the present application.

Forming an interlayer insulating layer on the gate insulating layer and etching the interlayer insulating layer to obtain a second via hole; a structure of the thin-film transistor having the vertical structure corresponding to this step is shown in (a) in FIG. 7.

Forming a second doped portion in the second via hole; a structure of the thin-film transistor having the vertical structure corresponding to this step is shown in (b) in FIG. 7.

Specifically, when forming the second doped portion on the buffer layer, amorphous silicon can be formed into a film by chemical vapor deposition, and hydrogen silicide, hydrogen gas, and hydrogen phosphide can be introduced during film formation, and then the amorphous silicon is patterned by exposure and etching to obtain the second doped portion. Since the phosphorus ions are contained in the amorphous silicon film formation process, no additional ion implantation is required.

Specifically, when the second doped portion includes the second lightly doped portion and the second heavily doped portion, the amorphous silicon can be formed into a film by chemical vapor deposition on the buffer layer, and hydrogen silicide, hydrogen gas, and hydrogen phosphide can be introduced in sequence during the film formation, and the two-step film formation is required. In a first step, a flow rate of hydrogen phosphide is large, and in a second step, the flow rate of hydrogen phosphide is small, this is followed by exposure and etching to form the second doped portion. Since the phosphorus ions are contained in the amorphous silicon film formation process, no additional ion implantation is required.

Specifically, a thickness of the second doped portion ranges from 300 nm to 1000 nm.

Figure 8:
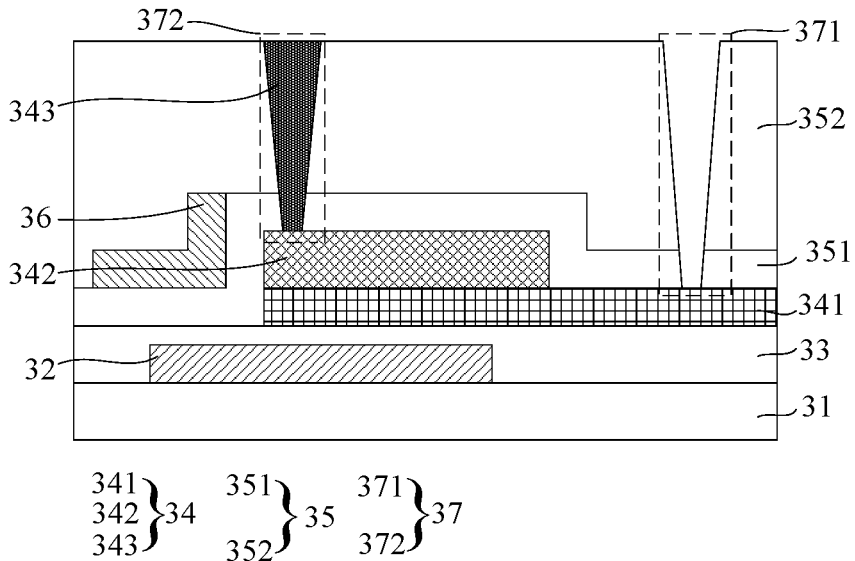
FIG. 8 is a third schematic diagram of the thin-film transistor having the vertical structure corresponding to each step in the method for preparing the thin-film transistor having the vertical structure provided by an embodiment of the present application.

Etching the interlayer insulating layer to obtain the first via hole; a structure of the thin-film transistor having the vertical structure corresponding to this step is shown in FIG. 8.

Forming a source/drain layer on the interlayer insulating layer; a structure of the thin-film transistor having the vertical structure corresponding to this step is shown in FIG. 3.

Embodiments of the present application provide the method for preparing the thin-film transistor with the vertical structure, and the thin-film transistor with the vertical structure prepared by the method for preparing the thin-film transistor with the vertical structure is provided by stacking the first doped portion, the channel portion, and the second doped portion, a polysilicon thin-film transistor with extremely small channel length can thus be realized, and by arranging the second doped portion in the via hole of the insulating layer, in this way, the second doped portion is connected to and partly in contact with the channel portion through the via hole, which can reduce the contact area between the second doped portion and the channel portion, thereby reducing the ions diffusing into the channel region and improving device stability of the thin-film transistor. Also, in the present application, by stacking the first doped portion, the channel portion, and the second doped portion, a projection area of the thin-film transistor is reduced, thus improving an aperture ratio of a display panel, which facilitates a development of products with high resolution and high refresh rate and even realizes functions of some chips.

Also, an embodiment of the present application provides an electronic device including the thin-film transistor with the vertical structure as described in any of the aforementioned embodiments.

According to the aforementioned embodiment, it can be known that:

Embodiments of the present application provide the thin-film transistor having the vertical structure and the electronic device; the thin-film transistor having the vertical structure includes the insulating substrate, the active layer, and the insulating layer, the active layer is disposed on the side of the insulating substrate, and the active layer includes the first doped portion, the channel portion, and the second doped portion provided in a stack, the insulating layer is disposed on the side of the channel portion away from the first doped portion, the insulating layer includes the via hole, wherein the second doped portion is disposed in the via hole, and the second doped portion is connected to and partly in contact with the channel portion through the via hole. In the present application, by stacking the first doped portion, the channel portion, and the second doped portion, a polysilicon thin-film transistor with extremely small channel length can be realized, and by arranging the second doped portion in the via hole of the insulating layer, in this way, the second doped portion is connected to and partly in contact with the channel portion through the via hole, which can reduce the contact area between the second doped portion and the channel portion, thereby reducing the ions diffusing into a channel region and improving device stability of the thin-film transistor. Also, in the present application, by stacking the first doped portion, the channel portion, and the second doped portion, a projection area of the thin-film transistor is reduced, thus improving an aperture ratio of a display panel, which facilitates a development of products with high resolution and high refresh rate and even realizes functions of some chips.

In the foregoing embodiments, the description of the embodiments has their own particular emphasis respectively, and as for a part which is not described in detail in a certain embodiment, reference can be made to the related description in other embodiments.

The thin-film transistor having the vertical structure and the electronic device provided by the embodiments of the present application are described in detail above. Specific examples are utilized in the present disclosure to explain a principle and implementations of the present application. The description of the foregoing embodiments is merely used to help understand the technical solution and a main idea of the present application. Those ordinarily skilled in the art shall appreciate that they still can modify the technical solutions recited in the foregoing respective embodiments or make equivalent substitutions for a part of technical features therein; and these modifications or substitutions will not render the essence of the corresponding technical solutions to go beyond the spirit and scope of the technical solutions in the respective embodiments of the present application.

What is claimed is:

1. A thin-film transistor having a vertical structure, comprising:

an insulating substrate;

an active layer, disposed on a side of the insulating substrate, the active layer comprising a first doped portion, a channel portion, and a second doped portion provided in a stack; and an insulating layer, disposed on a side of the channel portion away from the first doped portion, the insulating layer comprising via holes, and the via holes including a first via hole and a second via hole;

wherein the second doped portion is disposed in the second via hole, the second doped portion is connected to and partly in contact with the channel portion through the second via hole, and a contact area between the second doped portion and the channel portion is smaller than a surface area of the channel portion in contact with the second doped portion surface.

2. The thin-film transistor having the vertical structure as claimed in claim 1, wherein the thin-film transistor having the vertical structure further comprises a source/drain layer, the source/drain layer is disposed on a side of the insulating layer away from the active layer, the source/drain layer comprises a first electrode and a second electrode, the first electrode is electrically connected to the first doped portion through the first via hole, and the second electrode is in contact with and electrically connected to the second doped portion.

3. The thin-film transistor having the vertical structure as claimed in claim 2, wherein a first material of the first doped portion comprises N-type doped polysilicon, and a second material of the second doped portion comprises N-type doped amorphous silicon.

4. The thin-film transistor having the vertical structure as claimed in claim 2, wherein a doping ion concentration of the first doped portion on a side close to the insulating substrate is greater than a doping ion concentration of the first doped portion on a side close to the channel portion.

5. The thin-film transistor having the vertical structure as claimed in claim 2, wherein the first doped portion comprises a heavily doped portion and a lightly doped portion, a doping ion concentration of the heavily doped portion of the first doped portion is greater than a doping ion concentration of the lightly doped portion of the first doped portion, and the lightly doped portion of the first doped portion is disposed between the heavily doped portion of the first doped portion and the channel portion.

6. The thin-film transistor having the vertical structure as claimed in claim 5, wherein the lightly doped portion of the first doped portion comprises a third via hole, and the first electrode is electrically connected to the heavily doped portion of the first doped portion through the first via hole and the third via hole, and the first electrode is electrically connected to the lightly doped portion of the first doped portion through the first via hole and the third via hole.

7. The thin-film transistor having the vertical structure as claimed in claim 5, wherein a width of the heavily doped portion of the first doped portion is greater than a width of the lightly doped portion of the first doped portion, and the first electrode is electrically connected to the heavily doped portion of the first doped portion through the first via hole.

8. The thin-film transistor having the vertical structure as claimed in claim 5, wherein a first material of the first doped portion comprises N-type doped amorphous silicon.

9. The thin-film transistor having the vertical structure as claimed in claim 2, wherein a doping ion concentration of the second doped portion on a side close to the source/drain layer is greater than a doping ion concentration of the second doped portion on a side close to the channel portion.

10. The thin-film transistor having the vertical structure as claimed in claim 2, wherein the second doped portion comprises a heavily doped portion and a lightly doped portion, and a doping ion concentration of the heavily doped portion of the second doped portion is greater than a doping ion concentration of the lightly doped portion of the second doped portion, the lightly doped portion of the second doped portion is disposed between the heavily doped portion of the second doped portion and the channel portion, and the lightly doped portion of the second doped portion is in contact with a side part of the heavily doped portion of the second doped portion.

11. The thin-film transistor having the vertical structure as claimed in claim 10, wherein a ratio of a thickness of the heavily doped portion of the second doped portion to a thickness of the lightly doped portion of the second doped portion is greater than or equal to 5.

12. The thin-film transistor having the vertical structure as claimed in claim 10, wherein the second electrode extends into the second via hole, and the heavily doped portion of the second doped portion is in contact with a side surface of the second electrode.

13. The thin-film transistor having the vertical structure as claimed in claim 10, wherein a ratio of the doping ion concentration of the heavily doped portion of the second doped portion to the doping ion concentration of the lightly doped portion of the second doped portion is 10:1.

14. The thin-film transistor having the vertical structure as claimed in claim 2, wherein the second doped portion comprises a first portion disposed on the insulating layer away from the channel portion and a second portion located in the second via hole, and the first portion is connected to the second portion.

15. The thin-film transistor having the vertical structure as claimed in claim 2, wherein a diameter of the second via hole ranges from 2 μm to 4 μm.

16. The thin-film transistor having the vertical structure as claimed in claim 1, wherein a width of the first doped portion is greater than a width of the channel portion.

17. The thin-film transistor having the vertical structure as claimed in claim 1, wherein the thin-film transistor having the vertical structure further comprises a gate disposed on a sidewall of the insulating layer, and an orthographic projection of the gate on the sidewall of the insulating layer covers the channel portion.

18. The thin-film transistor having the vertical structure as claimed in claim 17, wherein the thin-film transistor having the vertical structure further comprises:

a light-shielding layer disposed between the insulating substrate and the active layer, and an orthographic projection of the light-shielding layer on the insulating substrate covers at least an orthographic projection of the second doped portion on the insulating substrate.

19. The thin-film transistor having the vertical structure as claimed in claim 18, wherein the gate is connected to the light-shielding layer.

20. An electronic device, wherein the electronic device comprises a thin-film transistor having a vertical structure, and the thin-film transistor having the vertical structure comprising:

an insulating substrate;

an active layer, disposed on a side of the insulating substrate, the active layer comprising a first doped portion, a channel portion, and a second doped portion provided in a stack; and an insulating layer, disposed on a side of the channel portion away from the first doped portion, the insulating layer comprising via holes, and the via holes including a first via hole and a second via hole;

wherein the second doped portion is disposed in the second via hole, the second doped portion is connected to and partly in contact with the channel portion through the second via hole, and a contact area between the second doped portion and the channel portion is smaller than a surface area of the channel portion in contact with the second doped portion surface.

\* \* \* \* \*